(12) United States Patent
Meyer et al.

(10) Patent No.: US 7,888,761 B2
(45) Date of Patent: Feb. 15, 2011

(54) DIRECT ELECTRON DETECTOR

(75) Inventors: Rudiger Reinhard Meyer, Oxford (GB); Angus Ian Kirkland, Oxford (GB)

(73) Assignee: Isis Innovation Limited (GB)

( * ) Notice: Subject to any disclaimer, the term of this patent is extended or adjusted under 35 U.S.C. 154(b) by 144 days.

(21) Appl. No.: 12/414,073

(22) Filed: Mar. 30, 2009

(65) Prior Publication Data

US 2009/0206428 A1 Aug. 20, 2009

Related U.S. Application Data

(63) Continuation of application No. 11/628,184, filed as application No. PCT/GB2005/002039 on May 24, 2005, now abandoned.

(30) Foreign Application Priority Data

May 27, 2004 (GB) ................................. 0411926.9

(51) Int. Cl.
*H01L 31/102* (2006.01)
(52) U.S. Cl. ..................... 257/458; 257/114; 257/227; 257/254; 257/293
(58) Field of Classification Search .............. 257/114, 257/227, 254, 293, 458
See application file for complete search history.

(56) References Cited

U.S. PATENT DOCUMENTS

| 3,586,857 A | 6/1971 | Glasow et al. |
| 5,021,854 A | 6/1991 | Huth |
| 5,030,831 A | 7/1991 | Coon et al. |
| 5,164,809 A | 11/1992 | Street et al. |
| 6,204,087 B1 | 3/2001 | Parker et al. |

FOREIGN PATENT DOCUMENTS

| DE | 4102285 | 8/1992 |
| EP | 279492 | 8/1988 |
| JP | 167061 | 6/2003 |

OTHER PUBLICATIONS

Arnold, L., et al., "The STAR silicon strip detector (SSD)", *Nuclear Instruments and Methods in Physics Research Section a—Accelerators Spectrometers Detectors and Associated Equipment*, 2003, pp. 652-658, vol. 499, No. 2-3.

(Continued)

*Primary Examiner*—Tan N Tran
(74) *Attorney, Agent, or Firm*—Saliwanchik, Lloyd & Eisenschenk

(57) ABSTRACT

An electron detector (30) for detection of electrons comprises a semiconductor wafer (11) having a central portion (12) with a thickness of at most 150 μm, preferably at most 100 μm, formed by etching an area of a thicker wafer. On opposite sides of the central portion (12) there are n-type and p-type contacts (16, 31). In operation, a reverse bias is applied across the contacts (16, 31) and electrons incident on the layer (15) of intrinsic semiconductor material between the contacts (16, 31) generate electron-hole pairs which accelerate towards the contacts (16, 31) where they may detected as a signal. Conductive terminals (24, 32) contact the contacts (16, 31) and are connected to a signal processing circuit in IC chips (28, 37) mounted to the semiconductor wafer (11) outside the active area of the detector (30). The contacts (16, 31) are shaped as arrays of strips extending orthogonally on the two sides of the intrinsic layer (15) to provide two-dimensional spatial resolution. In an alternative detector (10), there is a single contact (19) on one side to provide one-dimensional spatial resolution.

19 Claims, 9 Drawing Sheets

OTHER PUBLICATIONS

Avset, B.S., et al., "A New Microstrip Detector With Double-Sided Readout", *Ieee Transactions on Nuclear Science*, 1990, pp. 1153-1161, vol. 37, No. 3.

Baldazzi, G., et al., "X-ray imaging with a silicon microstrip detector coupled to the RX64 ASIC", *Nuclear Instruments and Methods in Physics Research Section a—Accelerators Spectrometers Detectors and Associated Equipment*, 2003, pp. 315-320, vol. 509.

Beccherle, R., et al., "Microstrip silicon detectors for digital radiography", *Nuclear Instruments & Methods in Physics Research Section A*, 1998, pp. 534-536, vol. 409.

Bisogni, M.G., "Imaging with Si microstrip detectors", *Physica Medica*, Sep. 1998, pp. 28-30, vol. 14, Supplement 2.

Daberkow, I., et al., "Performance of electron image converts with YAG single-crystal screen and CCD sensor", *Ultramicroscopy*, 1991, pp. 215-223, vol. 38.

De Ruijter, W.J., "Imaging Properties and Applications of Slow-Scan Charge-Coupled Device Cameras Suitable for Electron Microscopy", *Micron*, 1995, pp. 247-275, vol. 26, No. 3.

Fan, G.Y., et al., "ASIC-based event-driven 2D digital electron counter for TEM imaging" *Ultramicroscopy*, 1998, pp. 107-113, vol. 70, No. 3.

Fauth, F., et al., "Towards microstrip detectors for synchrotron powder diffraction facilities", *Nuclear Instruments & Methods in Physics Research Section a—Accelerators Spectrometers Detectors and Associated Equipment*, 2000, pp. 138-146, vol. 439, No. 1.

Fresser, H.S., et al., "Metal-Semiconductor-Metal structures as electron detector for 1 kV Microcolumns", *Microelectronic Engineering*, Feb. 1995, pp. 159-162, vol. 27, No. 1, Elsevier Publishers BV., Amsterdam, NL.

Fritz, G.S., et al., "Lateral pn-junctions as a novel electron detector for microcolumn systems", *Journal of Vacuum Science & Technology B: Microelectronics Processing and Phenomena, American Vacuum Society*, Nov. 1999, pp. 2836-2839, vol. 17, No. 6.

Fritz, G.S., et al., "How to improve lateral pn-junction electron detectors for microcolumn systems", *Microelectronic Engineering*, Sep. 2001, pp. 199-205, vol. 57-58, Elsevier Publishers BV., Amsterdam, NL.

Jurgens, B., et al., "Application of a pin photodiode as a low current electron detector with nanosecond time resolution", *J. Phys. E: Sci Instrum.*, 1975, pp. 629-630, vol. 8.

Krivanek, O.L., et al., "Applications of slow-scan CCD cameras in transmission electron microscropy", *Ultramicroscopy*, 1993, pp. 95-108, vol. 49.

Li, Z., et al., "Novel prototype Si detector development and processing at BNL", *Nuclear Instruments & Methods in Physics Research a—Accelerators Spectrometers Detectors and Associated Equipment*, 2002, pp. 303-310, vol. 478, No. 1-2.

Meyer, R.R., et al., "The effects of electron and photon scattering on signal and noise transfer properties of scintillators in CCD cameras used for electron detection", *Ultramicroscopy*, 1998, pp. 23-33, vol. 75, No. 1.

Meyer, R.R., et al., "Characterisation of the Signal and Noise Transfer of CCD Cameras for Electron Detection", *Microscopy Research and Technique*, 2000, pp. 269-280., vol. 43, No. 3.

Meyer, R.R., et al., "Experimental characterization of CCD cameras for HREM at 300 kV", *Ultramicroscopy*, 2000, pp. 9-13, vol. 85.

Peisert, A., "Silicon microstrip detectors", *Instrumentation in High Energy Physics*, 1992, pp. 1-77, F. Sauli ed., World Scientific.

Roberts, P.T.E., et al., "A CCD-Based Image Recording System for the CTEM", Ultramicroscopy, 1982, pp.385-396, vol. 8, No. 4.

Schwarz, A.S., "Heavy Flavor Physics at Colliders with Silicon Strip Vertex Detectors", Physics Reports-Review Section of Physics Letters, 1994, pp. 1-133, vol. 238, No. 1-2.

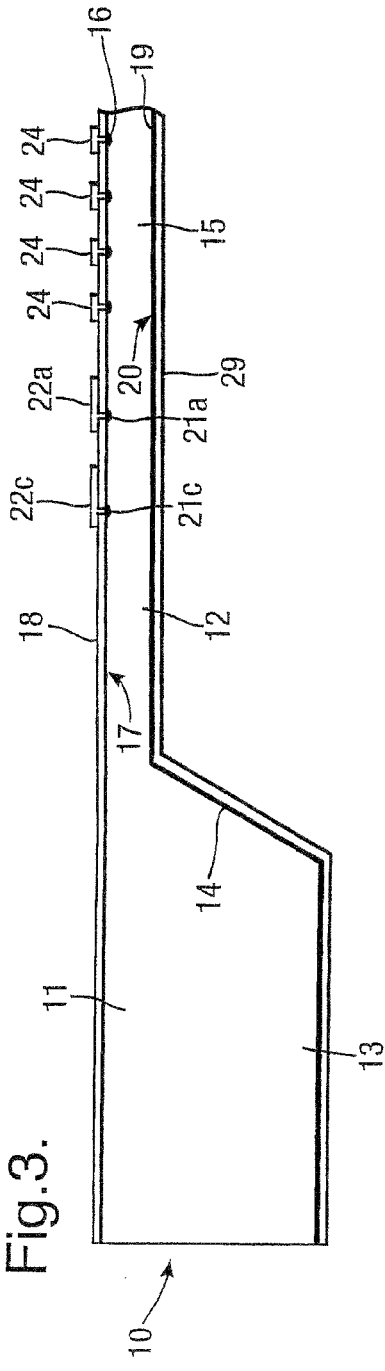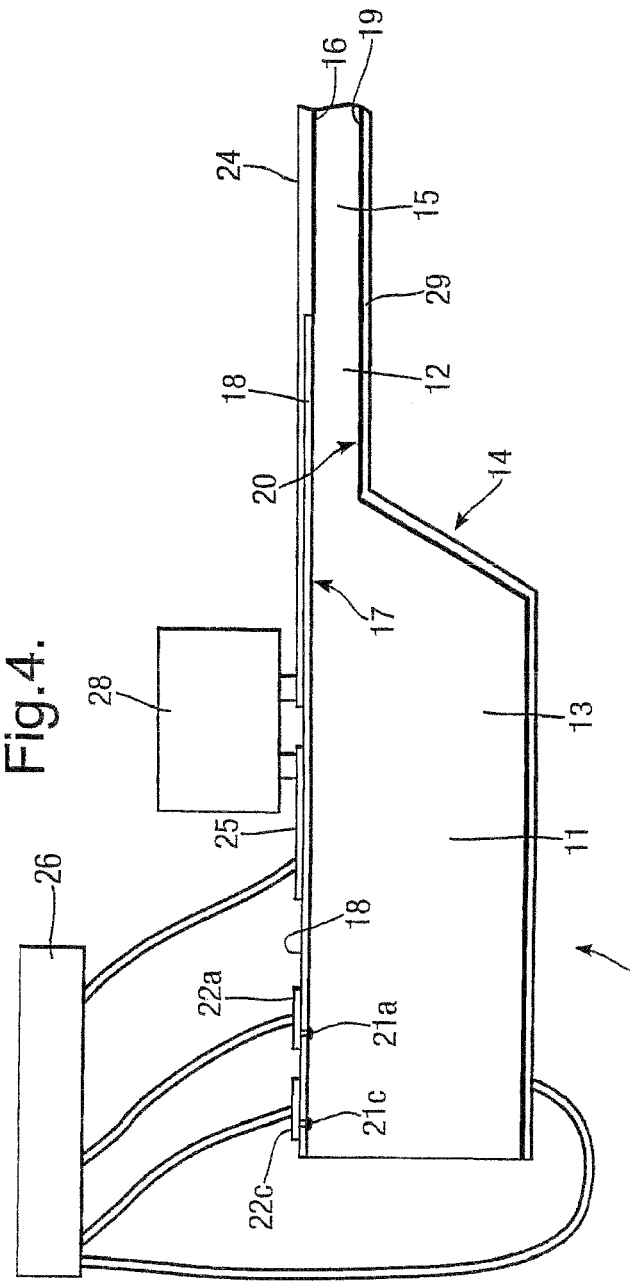

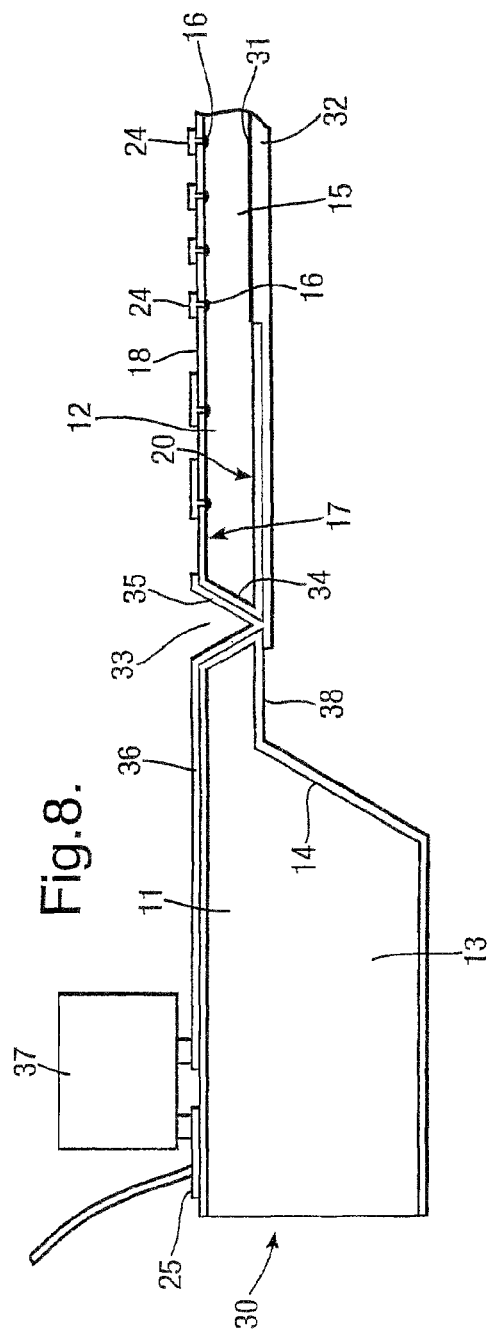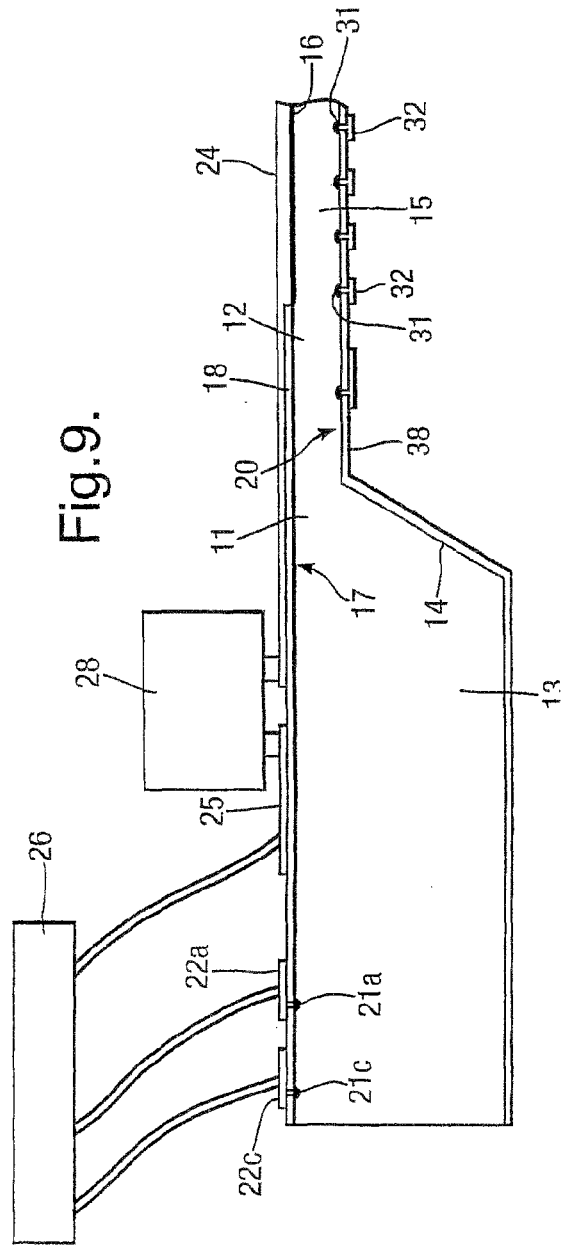

DIRECT ELECTRON DETECTOR

CROSS REFERENCE TO RELATED APPLICATIONS

The present application is a continuation of U.S. application Ser. No. 11/628,184, filed Feb. 12, 2007, which is the U.S. national stage application of International Application No. PCT/GB2005/002039, filed May 24, 2005, all of which are hereby incorporated by reference in their entirety.

The present invention relates to a detector capable of detecting electrons with energies in the range from 100 eV to 5 MeV.

Detection of electrons with energies in the range from 100 eV to 5 MeV is needed in a number of applications, notably in an electron microscope, for example a transmission electron microscope (TEM), or in an electron energy loss spectrometer (EELS). Depending on the application, it is desirable to achieve high spatial resolution and in some cases counting of individual electrons without requiring integration over time.

Currently, the detector normally used in applications such as a TEM is an indirect detector consisting of a scintillator coupled to a charge coupled device (CCD) detector by a fibre-optic coupling or a lens coupling. An example of such an indirect detector is disclosed de Ruijter, W. J., AImaging properties and application of slow-scan charge-coupled device cameras suitable for electron microscopy@, Micron, 1995. 26: p. 247-275. Electrons incident on the scintillator cause generation of photons which are detected by the CCD detector. Such indirect detection has serious drawbacks for the resolution, especially at electron energies of 200 keV and above. This is because a broad distribution of photons is generated from a sharp electron beam due to electron and photon scattering. A particularly deleterious effect is the back-scattering of electrons into the scintillator from the supporting fibre-optical plate. This type of event generates a bright and spot of light far from the incident point of the primary electron, thereby strongly contributing to the high-frequency noise while attenuating the high-frequency signal and thereby the high frequency Detection Quantum Efficiency (which is a measure comparing the signal-to noise ratio with that of an ideal detector).

Additional noise sources in CCD detectors are dark current noise and read out noise, which become significant at low dose and short exposure time, respectively. For slow-scan CCD detectors the beam has to be blanked while the image is read out, which typically takes 1 s for a 2 k×2 k camera. Continuous acquisition and read out is possible with frame-transfer CCD detectors, but at the cost of drastically reduced resolution (due to the small active CCD array) and large readout noise (due to the fast readout).

Before indirect electron detection with scintillator-coupled CCD chips became established experiments to directly illuminate a CCD chip with electrons were carried out as disclosed in Roberts, P. T. E., J. N. Chapman, and A. M. Macleod, AA CCD-based image recording-system for the CTEM. Ultramicroscopy@, 1982. 8(4): p. 385-396. However, each electron generates so many electron-hole pairs that the well capacity is reached with a dose of only 40 electrons per pixel. Furthermore, the MOS structures on the CCD chip are very sensitive to beam damage by charge trapping in the oxide layer. Finally, at medium and high energies, the lateral scattering of the electrons severely reduces the spatial resolution.

A recent proposal for direct electron detection is a prototype pixel detector disclosed in Fan, G. Y., et al., AASIC-based event-driven 2D digital electron counter for TEM imaging@, Ultramicroscopy, 1998. 70(3): p. 107-113. The detector comprises a high-resistivity detector chip bump-bonded to a CMOS ASIC which is aligned with the active area of the detector chip and contains an amplifier and counter for each pixel. In this design, the detector chip is thick enough to completely stop the incident electrons in order to prevent them from damaging the sensitive CMOS circuitry below. This again implies severe lateral spreading and poor spatial resolution.

It would be desirable to produce a detector which alleviates some or all of the problems with the current detectors, as summarised above.

According to the present invention, there is provided an electron detector for detection of electrons, comprising a semiconductor wafer having an active area with an array of contacts on a first side of the active area being one of n-type or p-type and at least one contact on a second, opposite side of the active area being the other of n-type or p-type, wherein the thickness of the active area of the semiconductor wafer is at most 150 µm.

In operation, a reverse bias is applied across the contacts on each side of the semiconductor wafer and electrons incident on the active area of the semiconductor wafer generate a signal at the contacts. In particular, incident electrons interact with the semiconductor material of the wafer to generate electron-hole pairs. The electrons are accelerated towards the n-type contact(s) and the holes are accelerated towards the p-type contact(s), creating a signal which may be detected at either or both contacts. Thus, the detector provides for direct detection of incident electrons.

Use of an array of contacts provides for spatially resolved detection. The electron or hole generated in the semiconductor wafer by an incident electron are accelerated to an adjacent contact thereby creating a signal at that contact. Thus, discrimination of signals between different contacts resolves the position of the incident electron. Conveniently, the contacts in the array are shaped as strips to resolve position in a direction perpendicular to the strips.

For the detection of electrons with energies in the range from 100 eV to 5 MeV, the detector provides a number of advantages over the indirect type of electron detector using a CCD detector described above. The detector of the present invention has a significantly higher detection quantum efficiency and is sufficiently sensitive to directly detect and count individual incident electrons without requiring integration over time. This means that it is capable of time-resolved detection and images can be obtained at arbitrarily high frame rates without additional readout noise.

The detector may include, in the active area, a layer of intrinsic material between the array of contacts on the first side of the active area and the at least one contact on the second side of the active area. In this case, a detector in accordance with the invention may have a similar construction and operation to the type of known PIN diode detector used to detect X-rays and high energy charged particles in particle physics experiments. However, a detector in accordance with the invention is thinner than such known PIN diode detectors and, consequently, provides the significant advantage of high spatial resolution in the detection of electrons with energies in the range from 100 eV to 5 MeV. The reasons for this are explained in more detail below.

Preferably, the active layer of the semiconductor wafer is formed in a portion of the semiconductor wafer which is thinner than the remainder of the semiconductor wafer.

This arrangement of the semiconductor wafer provides for convenience of manufacture. It is possible to use a semiconductor wafer produced by a conventional technique which will typically have a thickness of 300 µm to 600 µm. A portion of the semiconductor wafer which is to include the active area may be thinned, for example by etching. In addition, this arrangement of the semiconductor wafer increases the overall strength of the detector by the thicker remainder of the semiconductor wafer strengthening the thinner active area which is inevitably fragile due to its low thickness.

To provide for electrical connection to the contacts for the purpose of receiving the signals generated by incident electrons, the detector may comprise conductive terminals contacting the respective contacts of the array(s) of contacts.

In a first arrangement, said at least one contact on the second side of the active area comprises a single contact extending over the active area of the semiconductor wafer.

With this first arrangement, the detector allows one-dimensional resolution by discrimination between signals from respective contacts of the array. Such a one-dimensional detector may be used for example in an EELS. The signal from the single contact need not be monitored, thereby providing a significant advantage of simplifying the construction and manufacture because signals do not need to be routed from both sides of the semiconductor wafer.

In a second, alternative arrangement, said at least one contact on the second side of the active area comprises an array of contacts, the arrays of contacts on the first and second sides of the active area having a different arrangement from each other.

This second arrangement provides a further degree of resolution and allows two-dimensional resolution. This is because the electrons and holes of each pair generated in the semiconductor wafer by an incident electron is accelerated to the adjacent the contacts of both arrays on opposite sides of the semiconductor wafer, thereby creating a simultaneous signal at each of those adjacent contacts. Accordingly, by detecting coincident signals from contacts on both sides, a higher degree of resolution is achieved. Depending on the shape and arrangement of the contacts, the resolution may be two-dimensional. Such a two-dimensional detector may be used for example to record images and diffraction patterns in electron microscopy such as TEM.

Conveniently, the contacts in each array are shaped as strips extending in different directions on each side of the active area of the semiconductor wafer, preferably in orthogonal directions. Such an arrangement provides resolution in two dimensions by way of the strips on one side of the semiconductor wafer resolving the position in the first dimension and the strips on the other side of the intrinsic resolving the position in the second dimension.

Advantageously, the semiconductor wafer has vias and the conductive terminals contacting the array of contacts on the second side of active area of the semiconductor wafer extend through the vias to allow connection to be made to all the conductive terminals on the first side of the semiconductor wafer. This arrangement greatly simplifies the routing of the conductive terminals to allow the signals from the contacts to be monitored Preferably, the detector includes a signal processing circuit connected to the conductive terminals and arranged to process signals from the contacts contacted by the conductive terminals to provide detection of electrons incident on the active area of the semiconductor wafer.

Advantageously, the signal processing circuit is formed in at least one integrated circuit chip which is mounted on a surface of the semiconductor wafer outside the active area of the semiconductor wafer.

This location for the signal processing circuit outside the active area of the detector has the significant advantage that it is possible to prevent the incident electrons from reaching the integrated circuit chip(s) in which the signal processing circuit is formed without interfering with the detection of incident electrodes in the active area of the semiconductor wafer. For example, the integrated circuit chip(s) may be arranged at a sufficient distance from the active area at which the incident electrons are directed, or the integrated circuit chip(s) may be protected by an appropriate shield. Otherwise, electrons having energies in the range from 100 eV to 5 MeV, particularly at the higher end of this range, would damage the integrated circuit chip(s).

To allow better understanding, embodiments of the present invention will now be described by way of non-limitative example with reference to the accompanying drawings in which:

FIG. 3 is a cross-sectional view of the first electron detector taken along line III-III in FIG. 2;

FIG. 4 is a cross-sectional view of the first electron detector taken along line IV-IV in FIG. 2;

FIG. 8 is a cross-sectional view of the second electron detector taken along line VIII-VIII in FIG. 6;

FIG. 9 is a cross-sectional view of the second electron detector taken along line IX-IX in FIG. 6;

Figure 1:
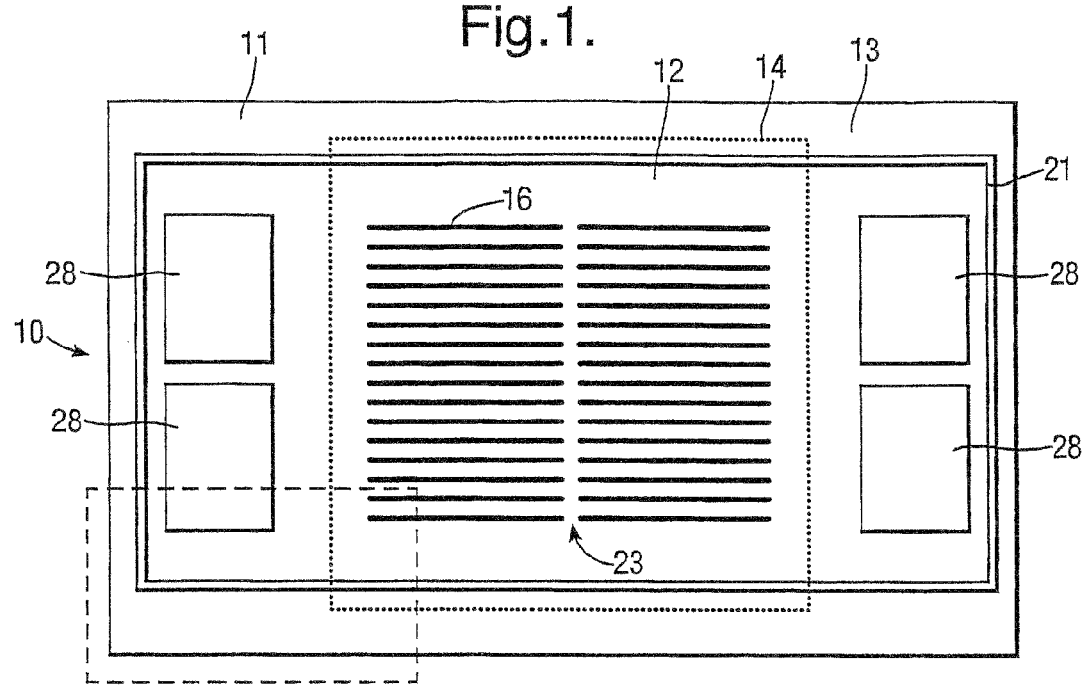
FIG. 1 is a schematic plan view of a first electron detector.
Figure 2:
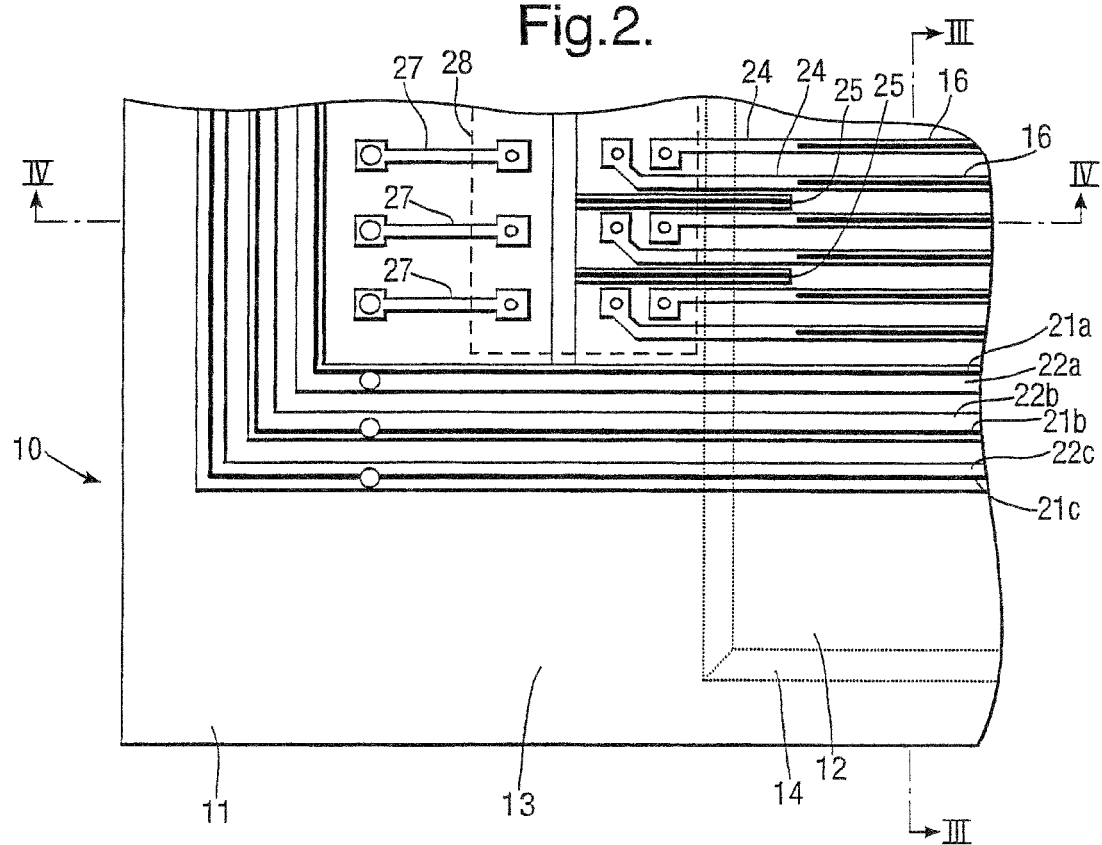
FIG. 2 is a detailed plan view of a portion of the first electron detector within the dashed outline in FIG. 1.

A first electron detector 10 in accordance with the present invention is illustrated in FIGS. 1 to 4. The first detector 10 has an arrangement of contacts to provide one-dimensional detection.

The first detector 10 comprises a semiconductor wafer 11 of intrinsic semiconductor material having a high resistivity. For convenience of manufacture, the semiconductor wafer 11 is made of silicon. As an alternative, any other semiconductor material could be used. Semiconductor materials other than silicon may offer better detection properties.

A central portion 12 in approximately the centre of the semiconductor wafer 11 is thinner than the remaining, peripheral portion 13 of the semiconductor wafer 11. The peripheral portion 13 strengthens the central portion 12 which is relatively fragile.

The semiconductor wafer 11 may be formed using conventional techniques so that it has an original thickness in the range from 300 µm to 600 µm, this being the thickness of the peripheral portion 13. The central portion 12 is formed by removing a portion of the semiconductor wafer 11. Preferably, the central portion 12 is formed by etching which has the advantage of allowing precise control of the thickness of the central portion 12 by selection of the etching time. Such etching causes the edges 14 of the central portion 12 to be tapered. The thickness of the central portion 12 is at most 150 µm, preferably at most 100 µm. The detection process and reasons for this thickness limit are discussed further below.

On a first side of the semiconductor wafer 11 (uppermost in FIGS. 3 and 4), the first detector 10 is provided with an array of contacts 16 arranged inside the central portion 12. The contacts 16 are shaped as strips extending parallel to one another. The contacts 16 are arranged in two groups on opposite sides of the central portion 12 of the semiconductor wafer 11, the groups being separated by a gap 23 running perpendicular to the direction in which the contacts 16 extend.

The contacts 16 are implanted in a first surface 17 of the semiconductor wafer 11 and are disposed below an oxide layer 18 formed on the first surface 17 of the semiconductor wafer 11 for insulation. The oxide layer 18 extends across the entire semiconductor wafer 11, that is over both the central portion 12 and the peripheral portion 13. The oxide layer 18 is an oxide of the material of the semiconductor wafer 11, for example silicon oxide. As an alternative, the oxide layer 18 could be replaced by any insulating layer for example a nitride or indeed any other insulating dielectric.

On the second side of the semiconductor wafer 11 opposite from the array of contacts 16 (lowermost in FIGS. 3 and 4), the first detector 10 is provided with a further, single contact 19 facing the array of contacts 16 and extending across at least the area of the array of contacts 16. For ease of manufacture, the single contact 19 extends across the entire semiconductor wafer 11 including both the central portion 12 and the peripheral portion 13. The further contact 19 is implanted in the second surface 20 of the semiconductor wafer 11 opposite to the first surface 17.

The contacts 16 and 19 are both formed of doped semiconductor material, The contacts 16 and 19 are of an opposite type from each other, that is either (1) the array of first contacts 16 are n-type and the contact 19 is p-type or (2) the array of contacts 16 are p-type and the contact 19 is n-type. The material of the semiconductor wafer 11 between the contacts 16 and 19 is a layer 15 of intrinsic semiconductor material which in use interacts with electrons for detection.

The first detector 10 is further provided with an array of conductive terminals 24, each contacting a respective contact 16 of the array of contacts 16. The conductive terminals 24 are deposited on the oxide layer 18 and extend through a window in the oxide layer 18 formed by etching to contact the respective contact 16. Each conductive terminal 24 extends along the entire length of the respective contact 16 and extends from the respective contact across the edge of the central portion 12 to the peripheral portion 13 of the semiconductor wafer 11. Also, on the outermost surface of the contact 19, there is provided a conductive terminal 29.

The first side of the semiconductor wafer 11 is also provided with a set of guard contacts 21 each in the shape of a ring enclosing both the active area of the semiconductor wafer 11 adjacent the contacts 16 in the central portion 12 and also integrated circuit chips 28 which are described further below. The guard contacts 21 are implanted in the first surface 17 of the semiconductor wafer 11 and are disposed below the oxide layer 18. A set of guard terminals 22, each contacting a respective guard contact 21. The guard terminals 22 are deposited on the oxide layer 18 and extend through a window in the outside layer 18 formed by etching to contact the respective contact 21. Each guard terminal 21 extends over the entirety of the respective contact 21. In general, there may be two or more guard contacts 21. The individual guard contacts 21 and guard terminals 22 are distinguished by the lower case letters a, b and c. The innermost guard contact 21a includes fingers 25 interdigitating with the end of the conductive terminal 24, the fingers 25 extending up to the array of contact 16 without overlapping.

The conductive terminals 24 are connected to a group of integrated circuit chips 28 mounted on a surface of the semiconductor wafer 11 in the peripheral portion 13. The integrated circuit chips 28 are connected to the terminals 24 by conventional bump-bonding technology. The integrated circuit chips 28 are desirably CMOS ASICs. The integrated circuit chips 28 provide some elements of a signal processing circuit for processing signals from the array of contacts 16 to provide detection of incident electrons, as described in detail below. As a result of the integrated circuit chips 28 being arranged outside the active area of the first detector 10 which is within the central portion 12, the integrated circuit chips 28 may be protected from electrons incident on the active area of the first detector 10, either by limiting beam of the incident electrons and/or providing the integrated circuit chips 28 with appropriate shielding.

On the first side of the semiconductor wafer 11, deposited on the oxide layer 18, are contact terminals 27 connected to and extending outwardly from the integrated circuit chips 28. The contact terminals 27, the guard terminals 22 and the conductive terminal 29 contacting the contact 19 on the second side of the semiconductor wafer 11 are all connected to an external circuit 26. The external circuit 26 provides bias voltages for the array of contacts 16 through some of the contact terminals 27, and also receives digital output signals from the integrated circuit chips 28 through others of the contact terminals 27. In addition, the external circuit 26 provides bias voltages for the further contact 19 and the guard contacts 21 through the conductive terminal 29 and the guard terminals 22, respectively.

In the first detector 10, the signals received by the contact 19 on the second side of the semiconductor wafer 11 are not monitored. Consequently, it is not necessary to make any electrical connection between the contact 19 and the signal processing circuit. This greatly simplifies the structure and hence the manufacture of the first detector 10.

A second detector 30 in accordance with the present invention is illustrated in FIGS. 5 to 9. The second detector 30 has basically the same construction as the first detector 10 except for some changes in the arrangement of contacts so as to provide two-dimensional detection. For brevity, in respect of elements which are common between the first detector 10 and the second detector 30, the same reference numerals will be used and a description thereof will not be repeated.

The second detector 30 has a semiconductor wafer 11 with the same construction as in the first detector 10.

Figure 5:
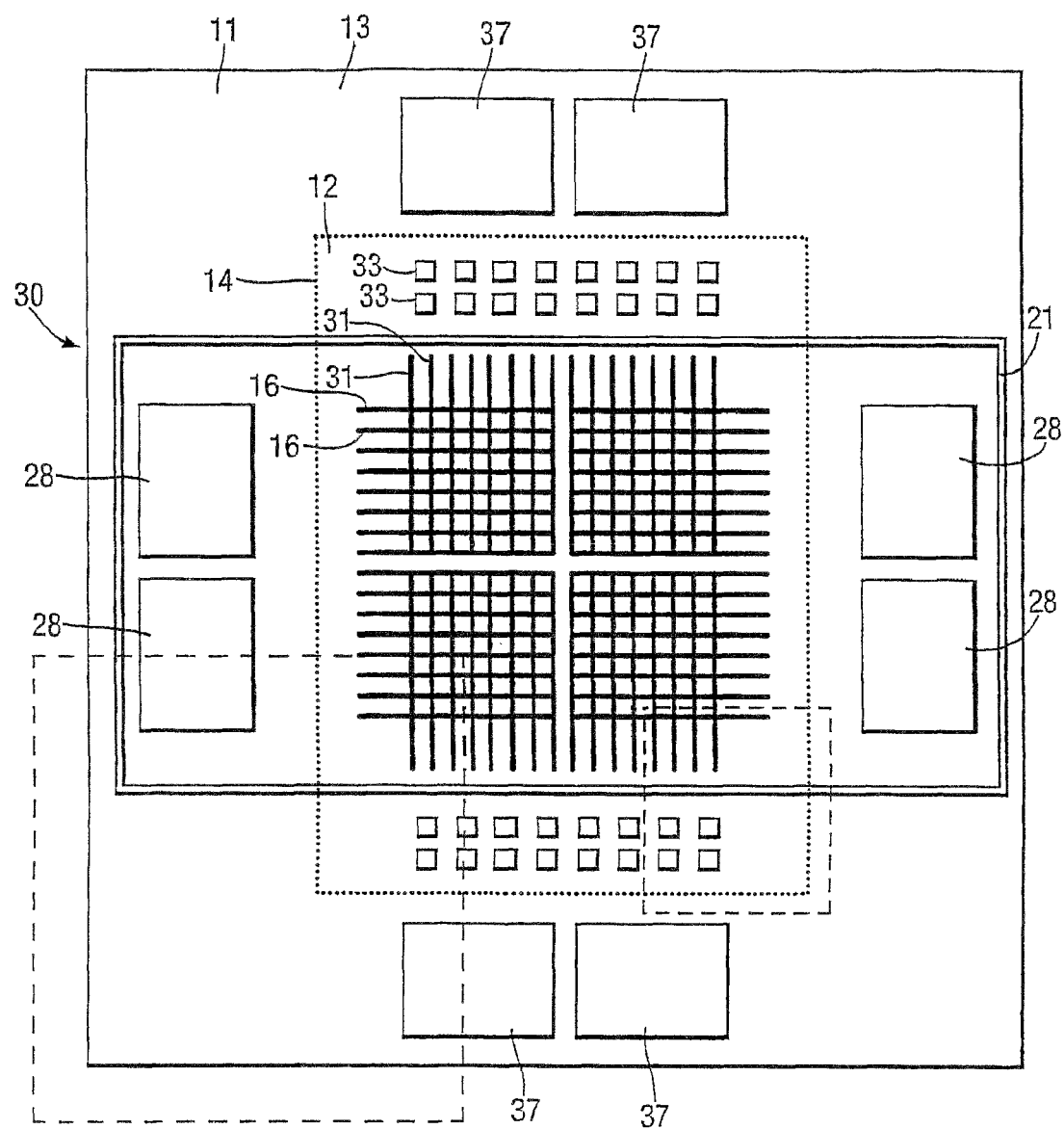
FIG. 5 is a schematic plan view of a second electron detector.
Figure 6:
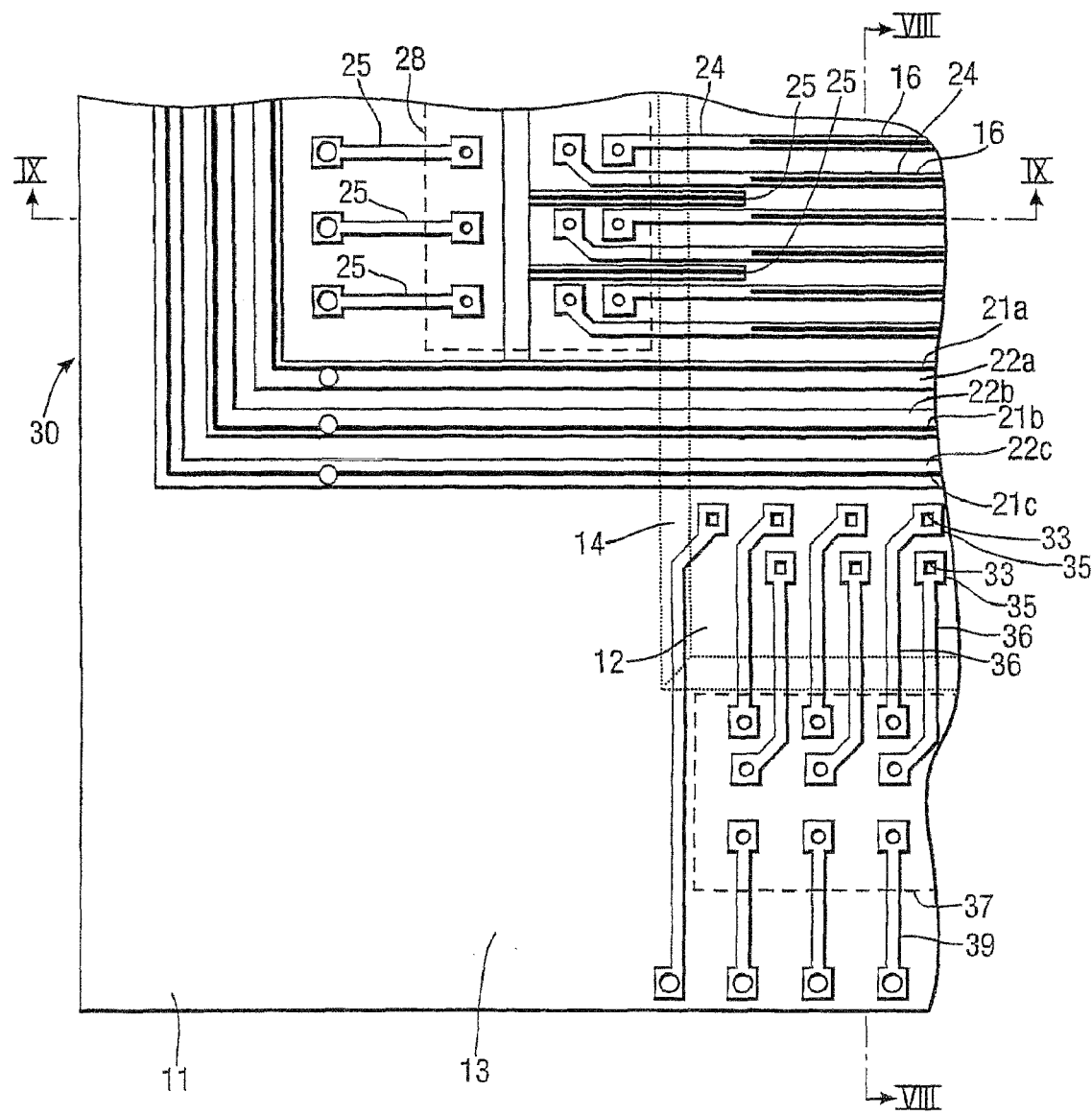
FIG. 6 is a detailed plan view of a portion of the second electron detector within the dashed outline in FIG. 5.
Figure 7:
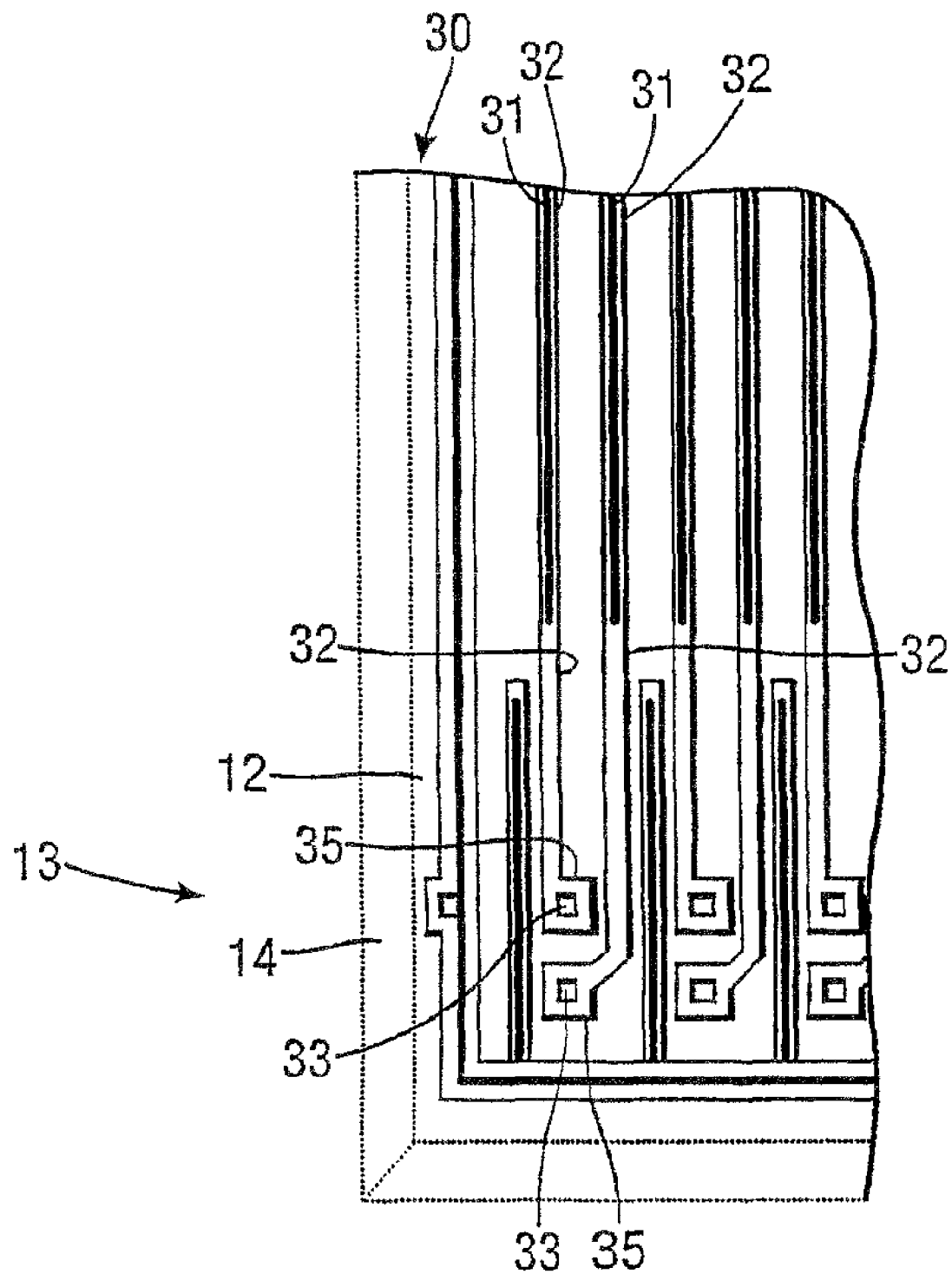
FIG. 7 is a detailed plan view of a portion of the second electron detector within the dotted outline in FIG. 5 viewed from the opposite side from FIGS. 5 and 6.

The second detector 30 also has an array of contacts 16 on the first side of the semiconductor wafer 11 having the same construction and arrangement as in the first detector 10. However, the second detector 30 has contacts 31 on the second side of the semiconductor wafer 11 which are different from the contact 19 of the first detector 10. In particular, on the second side of the semiconductor wafer 11, the second detector 30 is provided with a further array of contacts 31 shaped as strips extending parallel to one another. The further array of contacts 31 are shown in FIG. 5 in order to illustrate their relationship with the array of contact 16, although in fact the further array of contact 31 are formed on the second side of the semiconductor wafer 11 as best seen in FIG. 7 to 9. The contacts 31 of the further array are implanted in the second surface 20 of the semiconductor wafer 11 and are disposed below an oxide layer 38 formed on the second surface 20 of the semiconductor wafer 11. The oxide layer 38 extends across the entire semiconductor wafer 11, that is over both the central portion 12 and the peripheral portion 13. The oxide layer 38 is an oxide of the material of the semiconductor wafer 11, for example silicon oxide.

The further array of contacts 31 have the same arrangement as the array of contacts 16 on the first side of the semiconductor wafer 11 but extending in a direction orthogonal to the direction in which the array of contacts 16 extend. The array of contacts 16 and the further array of contacts 31 face one another and extend across substantially the same area of the semiconductor wafer 11 which area, in use, acts as the active area of the second detector 30.

Similarly, the second detector 30 has further conductive terminals 32 each contacting a respective contact 31 of the further array. The further conductive terminals 32 are deposited on the oxide layer 38 and extend through a window in the oxide layer 38 formed by etching to contact the respective contact 31. Each further conductive terminal 33 extends along the entire length of the respective contact 31 and beyond the respective contacts 31 into the area of the central portion 12 outside the active area. In addition, the further conductive terminals 32 are arranged as follows to allow a connection to be made to all the conductive terminals 24 and 32 on the same side of the semiconductor wafer 11.

The semiconductor wafer 11 is formed with vias 33 extending through the semiconductor wafer 11 within the central portion 12 but outside the active area of the second detector 30 and outside the guard contacts 21. A separate via 33 is aligned with each one of the further contacts 33. During manufacture, the vias 33 are formed by etching and so have a tapered inner surface 34. The oxide layers 18 and 38 on each side of the semiconductor wafer 11 are interconnected by extending around the tapered inner surface 34 of the vias 33.

The further conductive terminals 32 each have a connecting portion 35 deposited on the oxide layers 18 or 38. The connecting portions 35 extend from the respective conductive terminals 32, through the vias 33 and onto the first side of the semiconductor wafer 11 on which the further array of contacts 16 are formed. Furthermore, the further conductive terminals 32 each include an arm 36 extending from a respective connecting portion 35, over the central portion 12 of the semiconductor wafer 11 and onto the peripheral portion 13 of the semiconductor wafer 11.

The arms 36 of the further conductive terminals 32 are connected to further integrated circuit chips 37 mounted on the first surface 17 of the semiconductor wafer 11 in the peripheral portion 13. The integrated circuit chips 37 are connected to the terminals 24 by conventional bump-bonding technology. The integrated circuit chips 37 are desirably CMOS ASICs. Thus, the formation of the further conductive terminals 32 through the vias 33 allows the connection to be made to both arrays of contacts 16 and 31 on the same side of the semiconductor wafer 11, i.e. the first side 17. In the second detector 30, elements of the signal processing circuit are formed in the further integrated circuit chips 37 connected to the further conductive terminals 32, as well as the integrated circuit chips 28 connected to the first conductive terminals 24.

On the second side of the semiconductor wafer 11, deposited on the oxide layer 18, are further contact terminals 39 connected to and extending outwardly from the further integrated circuit chips 37. The further contact terminals 39 are additionally connected to the external circuit 26.

Next, the operation of the two detectors 10 and 30 will be described.

To use the detectors 10 and 30, a reverse bias is applied by a source (not shown) across the contacts 16 and 19, or across the contacts 16 and 31, on opposite sides of the semiconductor wafer 11. Under this reverse bias, the layer 15 of intrinsic material in the active area of the detector 10 or 30 becomes depleted of charge carriers.

Bias voltages are also applied to the guard contacts 21a, 21b, and 21c as follows. The innermost guard contact 21a is held at the same potential as the contact 16 on the first side of the semiconductor wafer 11. This is to prevent leakage current generated outside the active area of the semiconductor wafer 11 from reaching the contacts 16. The outermost guard contact 21c is held at the same potential as the contacts 19 or 31 on the second side of the semiconductor wafer 11. This is to prevent leakage current across the sawn die edges of the semiconductor wafer 11. The intermediate guard contact 21b is held at a potential intermediate that of the innermost and outermost contact 21a and 21c. Further intermediate guard contacts 21b could be used, if desired.

When electrons with energies in the range from 100 eV to 5 MeV (at least) are incident on the active area of the detector 10 or 30, the electrons interact with the layer 15 of intrinsic material and generate electron-hole pairs at a rate of one pair per 3.65 eV (in silicon) of energy lost by the electrons. Thus, a large number of electron-hole pairs are generated. For example, in the case of an active area of the semiconductor wafer within the central portion 12 having a thickness of 50 µm, electrons may lose an energy of around 15 keV which equates to the generation of around 4,000 electron-hole pairs.

In the electric field imposed by the reverse bias, the holes are accelerated towards the adjacent p-type contact (which may be any of the contacts 16, 19 or 31 depending on the specific construction) and similarly the electrons are accelerated towards the adjacent n-type contact (which again may be any of the contacts 16, 19 or 33). The electrons and holes reaching the respective, adjacent contact 16 or 31 of the arrays of contacts 16 and 31 generate a signal which passes via the respective conductive terminal 24 or 32 to the signal processing circuit. These signals are processed by the signal processing circuit to provide detection of the electrons incident on the detector 10 or 30. Accordingly, the active area of the first detector 10 is the area of the layer 15 of intrinsic material which is adjacent the contacts 16 and similarly, the active area of the second detector 30 is the area of the layer 15 of intrinsic material which is adjacent the contacts 16 and 19.

As incident electrons create a signal on the adjacent ones of the contacts 16 and 31, discrimination of the signals from different contacts 16 in the array of contacts 16 and different contacts 31 in the further array of contacts 31 provide for spatial resolution in the detection result.

In the case of the first detector 10, the array of contacts 16 provide spatial resolution in a single dimension, that is perpendicular to the direction in which the contacts 16 extend. The arrangement of the contacts 16 in two separate groups provides for limited spatial resolution in the perpendicular direction and has the advantage of facilitating alignment of the first detector 10 with a beam of incident electrons.

In the case of the second detector 30, the array of contacts 16 provides spatial resolution in one direction and the further array of contacts 31 provides resolution in an orthogonal direction, thereby providing two-dimensional spatial resolution. Of course, other arrangements for the contacts 16 and 31 could similarly provide spatial resolution, but the particular arrangement of the contacts 16 and 31 in the described embodiment are particularly convenient and simple to implement.

Figure 10:
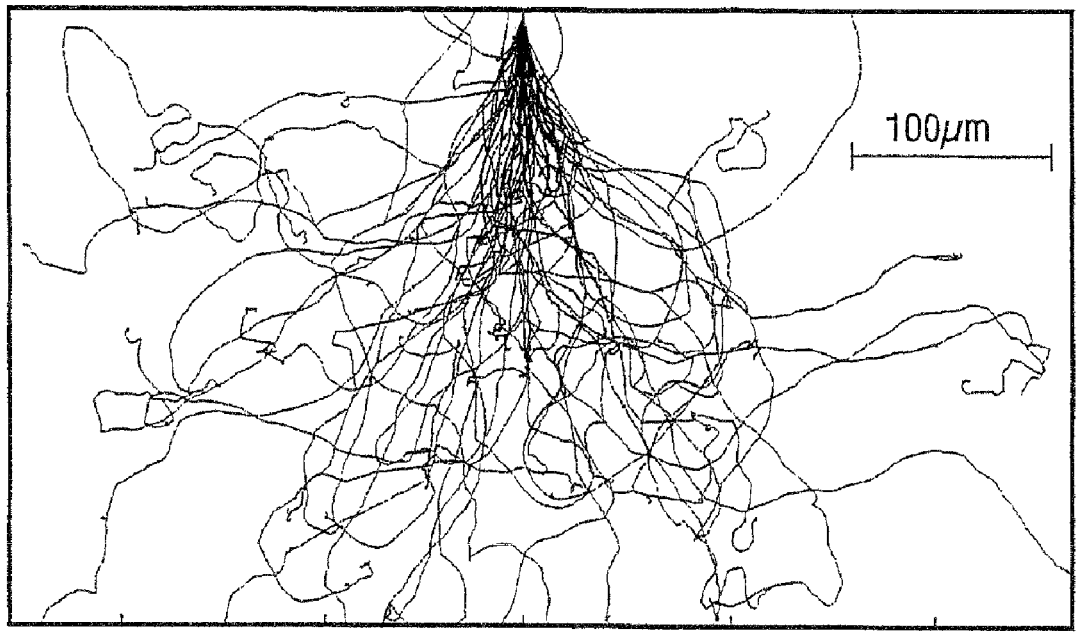
FIG. 10 is an image of a Monte-Carlo simulation for 300 keV electrons incident on a semiconductor wafer of thickness 300 µm.
Figure 11:
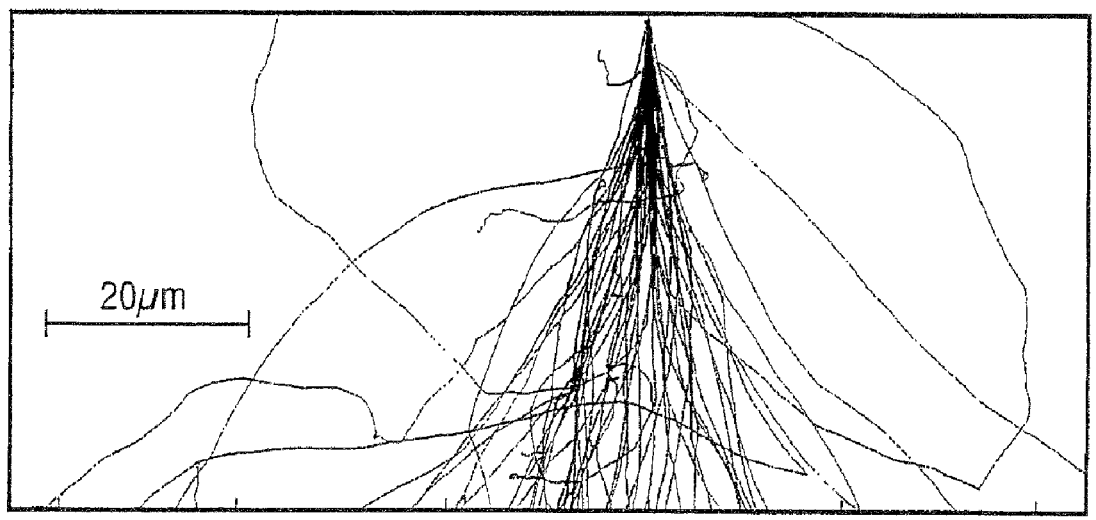
FIG. 11 is an image of a Monte-Carlo simulation for 300 keV electrons incident on a semiconductor wafer of thickness 50 µm.

It has been appreciated that the relatively small thickness of the semiconductor wafer 11 in the active area inside the central portion 12 provides significant advantages as compared to the use of an equivalent structure having a typical thickness for a semiconductor wafer manufactured using conventional techniques in the range from 300 μm to 600 μm. In particular, the spatial resolution is increased significantly, because the electron trajectories undergo a significantly lower spatial spread, most electron trajectories being relatively straight. This has been demonstrated using a detailed Monte-Carlo simulation to predict the performance of the detector. The results of such a simulation is shown in FIGS. 10 and 11. Both FIGS. 10 and 11 show a Monte-Carlo simulation for 50 trajectories of a 300 keV electron in silicon. FIG. 10 illustrates the case that the thickness of the intrinsic layer is 300 μm which is not in accordance with the present invention but is around the low end of the range of typical thicknesses for a wafer of silicon manufactured using conventional techniques. FIG. 11 illustrates the case that the semiconductor wafer 11 has a thickness of 50 μm in the active area and is therefore in accordance with the present invention.

From FIGS. 10 and 11, it is clear that the trajectories for the thick semiconductor wafer 11 illustrated in FIG. 10 undergo a large lateral spreading, whereas for the example of the present invention illustrated in FIG. 11 the spreading is much less and most electrons pass through the detector on a relatively straight path. As electron-hole pairs are generated along substantially the entire trajectory, the large lateral spreading in the thick case illustrated in FIG. 10 would preclude a resolution of better than around 100-200 μm. In contrast, in the example of the present invention illustrated in FIG. 11, a much improved resolution is obtained.

Accordingly, the present invention involves the use of an semiconductor wafer 11 having a thickness in the active area of at most 150 μm. It is expected that most useful devices would have a thickness of at most 100 μm. Surprisingly, detectors having such a thickness produce a sufficient signal to allow detection of individual electrons without requiring integration over time.

The thickness of the active area of the semiconductor wafer 11 can be reduced to increase the resolution. As to a minimum thickness, in principle the thickness of the active area of the semiconductor wafer 11 can be reduced as much as is desired, but there are two practical considerations to take into account. The first consideration is to maintain sufficient strength in the active area of the semiconductor wafer 11, as thin semiconductor layers become very fragile. However, the higher thickness of the peripheral portion 13 does reinforce the central portion 12. The second consideration is to obtain a signal of sufficient magnitude as the number of electron-hole pairs generated decreases with the thickness of the active area of the semiconductor wafer 11. Based on these considerations, it is expected that most detectors will have a thickness of at least 20 μm, but lower thicknesses could nonetheless be used provided the increased fragility is acceptable and provided a sufficiently sensitive signal processing circuit is used.

As to the dimensions of the contacts 16 and further contacts 31, the pitches of the array of contacts 16 and the further array of contacts 31 may be chosen to match or be slightly greater than the resolution resulting from the spreading of electron trajectories in the semiconductor wafer 11. The spreading will depend on the thickness of the active area of the semiconductor wafer 11 and the semiconductor material chosen. The spreading may be predicted using a simulation, such as a Monte-Carlo simulation of the type shown in FIG. 11, or alternatively may be determined experimentally. It is expected that for most practical devices the pitch would be at most 100 μm, or more usually at most 50 μm, a typical value being around 20 μm. It is expected that the pitch will be at least 10 μm.

As to the width of the contacts 16 and 31, for a given pitch in the array of contacts 16 or 31, there is a balance between (a) decreasing the width of the contacts 16 or 31 which is desirable to decrease the capacitance, and (b) increasing the width of the contacts 16 or 31 which is desirable to decrease the resistance of the contacts 16 or 31. In fact, it is expected that the optimal ratio of the width of the contacts 16 or 31 to the gap between the contacts 16 or 31 will be around 1:1.

In the detectors 10 and 30, the contacts 16, 19 and 31 are implanted in the respective surfaces 17 and 20 of the semiconductor wafer 11. However, as an alternative, contacts having basically the same arrangement and effect could be deposited or could be formed as an integral part of the semiconductor wafer by conventional techniques. Similarly, as an alternative to the simple PIN (p-intrinsic-n) diode construction of the detector 10, more complicated constructions could be used to achieve the detection in the same way. One possibility is to use an avalanche diode construction which has a similar construction to the detector 10 except for an additional avalanche layer adjacent the contacts 19 or 31 on the rear side of the detector. The avalanche layer is of opposite type from the adjacent contact.

The first and second detectors 10 and 30 may be manufactured using conventional semiconductor techniques which will now be described.

To manufacture the first detector 10, firstly the semiconductor wafer 11 is produced using conventional techniques. Initially the semiconductor wafer 11 has the same thickness over its entire area, typically 300 μm to 600 μm. Both surfaces of the semiconductor wafer 11 are polished and oxidised to produce the oxide layer 18 and also an oxide layer on the second side of the semiconductor wafer, both with a thickness of around 1-2 μm. The oxide layer on the second side of the semiconductor wafer 11 in the desired area of the central portion 12, is removed by lithographically providing an etch-back mask and plasma etching. Subsequently, the central portion 12 is formed by TMAH etching of the exposed material of the semiconductor wafer 11. Precise control of the etching time allows control of the thickness of the central portion 12. For example, if the original thickness of the semiconductor wafer 11 is 350 μm and the desired thickness of the central portion 12 is 50 μm, then at an etching rate of 0.38 μm/min, this takes around 11 hours.

Next a mask is lithographically formed on the oxide layer 18 on the first side of the semiconductor wafer 11 to expose the desired shape of all the contacts on that side, namely form the array of contacts 16 and the guard contacts 21. Then a plasma etch is performed to remove the exposed portions of the oxide layer 18 leaving windows. The remaining oxide on the second side of the semiconductor wafer 11 is also removed by plasma etching.

Next, the contacts 16 and 19 are formed by implanting appropriate dopants. On the first side of the semiconductor wafer 11, the implantation occurs through the windows formed in the oxide layer 18 to form the array of contacts 16 and the guard contacts 21.

After performing rapid thermal annealing, the entire surface on both sides of the semiconductor wafer 11 is metalised, typically with a thickness of around 2 μm on the first side and a thickness of 1 μm on the second side. The deposited metal layer on the second side constitutes the conductive terminal 29. On the first side of the semiconductor wafer 11, the deposited metal layer is lithographically plasma etched to provide the various terminals on the first side of the semiconductor wafer into the desired shape.

In summary, the manufacture of the first detector 10 may be summarised by the following process flow:

0 FZ High-Res n-type 4" wafer, both sides polished
1 Wet oxidation, 1-2 µm, both sides
2 Lithography with etchback mask (back side)
3 Plasma etch exposed oxide layer on back side
4 TMAH etchback to desired thickness of active area
5 Lithography with oxide mask (front side)
6 Plasma etch exposed oxide layer on front side
7 Plasma etch remaining oxide layer on back side
8 Strip resist
9 Grow thin protective oxide layer on both sides
10 Front side contact implant (front side)
11 Back side contact implant
12 Rapid Thermal Annealing
13 Short oxide etch (50-100 nm)
14 Metal deposition on front side (2 µm)
15 Metal deposition on back side (1 µm)
16 Resist on front side
17 Lithography with metal mask (front side)
18 Plasma etch exposed A1 on front side and remove resist The second detector 30 may be manufactured using an equivalent process with an additional etching step to form the vias 33 and with additional steps to form the further array of contact 31 on the second side of the semiconductor wafer 11 in the same manner as forming the array of contacts 16 on the first side of the semiconductor wafer 11. In this case, for the lithography steps on the second side of the semiconductor wafer 11, the photo-resistive mask is applied by spraying rather than by a spin-on technique in order to ensure proper coverage over the different heights of the central portion 12 and the peripheral portion 13. The process flow for the second detector 30 may therefore be summarised as follows.

1 Thermal oxidation (both sides)
2 Spin on resist front side
3 Spin on resist back side
4 Photolithography via mask front side
5 Photolithography cavity mask back side
6 Develop resist
7 Etch exposed oxide
8 TMAH etch to form central portion 12 from the back side and vias 33 from the front side
9 Ion implantation of p-type counter dopant on back side
10 Etch remaining oxide
11 Thermal oxidation (both sides)
12 Spin on resist front side
13 Spray on resist back side
14 Photolithography front strip mask (front side)
15 Photolithography back strip mask (back side)
16 Develop resist
17 Etch exposed oxide to form windows
18 Ion implantation, p-type, front side
19 Ion implantation, n-type, back side
20 Thermal annealing to drive in all implants
21 Deposit metal on front side
22 Deposit metal on back side
23 Spin on resist front side
24 Spray on resist back side
25 Photolithography front metal mask
26 Photolithography back metal mask
27 Develop resist
28 Etch exposed metal (both sides)
29 Passivate (both sides)
30 Spin on resist front side
31 Photolithography window mask front side
32 Develop resist
33 Window etch front side The counter-dopant implanted in step 9 avoids a conductive surface channel between the further contacts 31 on the second side. It is similar to the channel-stop implant in CMOS technology. The dose used for the n-strip implantation in step 19 is larger than that in step 9 to ensure that the strips formed are n-type, surrounded by moderately p-type material.

Figure 12:
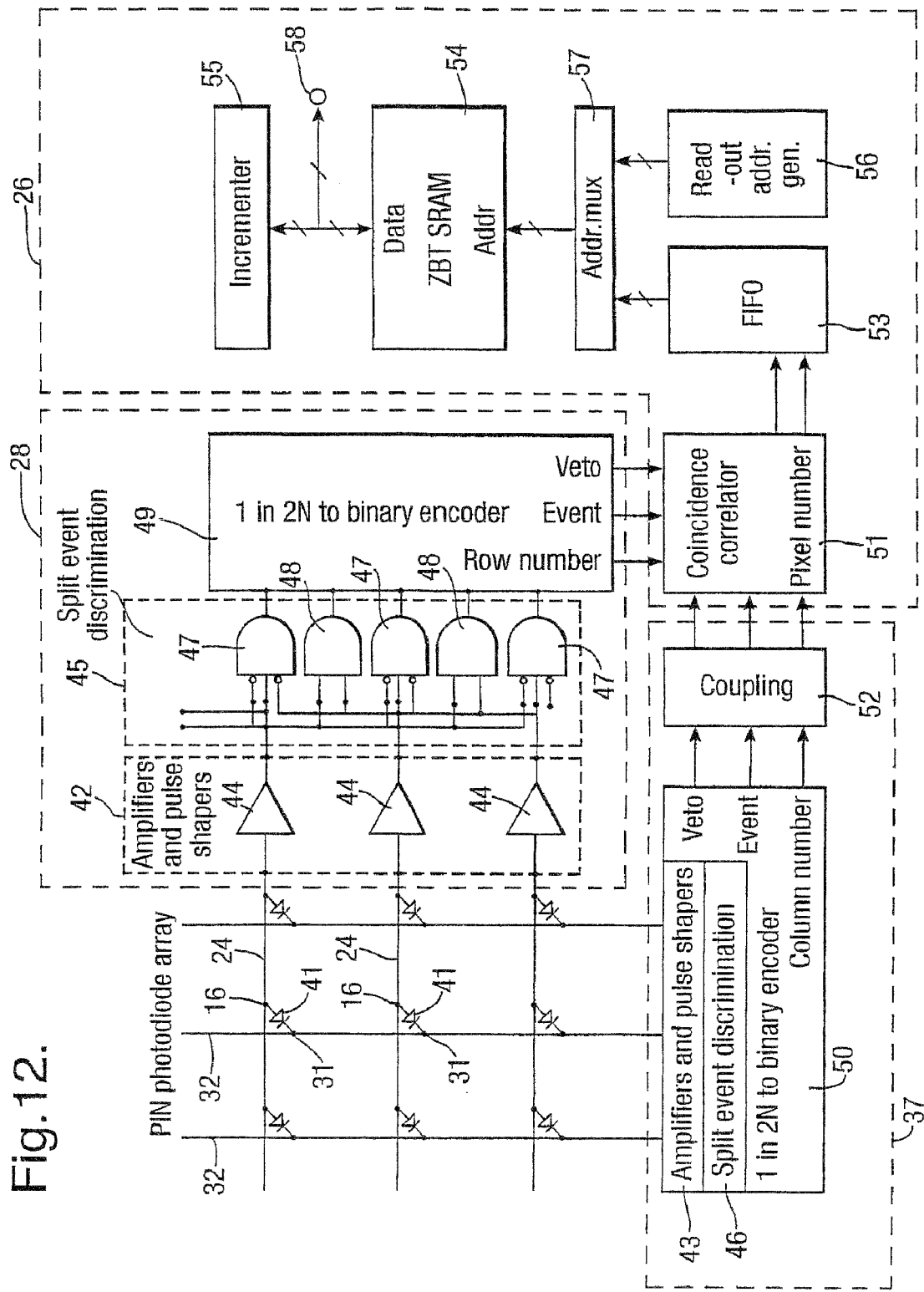
FIG. 12 is a diagram of the signal processing circuit for the second electron detector.

The signal processing circuits for the detectors 10 and 30 will now be described. It is most convenient first to describe the signal processing circuit for the second detector 30 which is illustrated in FIG. 12. The signal processing circuit is formed in the integrated circuit chips 28, the further integrated circuit chips 37 and the external circuit 26 as shown in dashed outline in FIG. 12.

In FIG. 12, the semiconductor wafer 11 is shown schematically as an array of diodes 41. Each diode 41 represents a portion of the continuous layer 15 of semiconductor material between a respective contact 16 and a respective contact 31 which effectively constitutes a diode. The conductive terminals 24 contacting the contacts 16 and the further conductive terminals 32 contacting the contacts 31 are also shown in FIG. 12. The elements outside the semiconductor wafer 11 in FIG. 12 constitute the signal processing circuit. All the elements of the signal processing circuit may be formed in the integrated circuit chips 28 and 37, or alternatively some of the elements may be formed in a separate component connected to the integrated circuit chips 28 and 37 through an output terminal 58.

The conductive terminals 24 and 32 are connected to respective amplifier circuits 42 and 43. Each amplifier circuit 42 and 43 includes a plurality of amplifiers 44 each connected to a respective conductive terminal 24 or 32. The amplifiers 44 amplify the signal from a respective contact 16 or 31 and are arranged to convert received charge pulses above a certain threshold value into a digital output signal. For example, each amplifier 44 may be formed by an amplifier stage which amplifies the received signal and a threshold detection stage which outputs a digital output signal representing whether the received signal is above or below the threshold.

The signals output from the amplifier circuits 42 and 43 are supplied to respective split event discriminations circuits 45 and 46 arranged to discriminate between (1) a signal from a single contact 16 or 31, caused by detection of an electron on a portion of the layer 15 of semiconductor material aligned with a respective contact 16 or 31, and (2) signals from both of two adjacent contacts 16 or 31, caused by an electron being incident on a portion of the layer 15 of semiconductor material intermediate two adjacent contacts 16 or 31.

In particular, the split event discrimination circuits 45 and 46 is constituted by main AND gates 47 and intermediate AND gates 48.

The signal from each contact 16 or 31 is supplied to an input of a respective main AND gate 47 associated with that contact 16 or 31. In addition, inverting inputs of each given main AND gate 47 are supplied with the signal from the two contacts 16 or 31 adjacent the contact 16 or 31 associated with the given main AND gate 47 (except of course for the contacts 16 and 31 on the edge of the arrays). Accordingly, the main AND gates 47 output a signal when the associated contact 16 or 31 outputs a signal indicating a detection event, but neither of the adjacent contacts 16 or 31 output such a signal indicating a detection event.

In addition, the signals from each pair of adjacent contacts 16 or 31 are supplied to an input of a respective intermediate AND gate 48. Accordingly, the intermediate AND gates 48 output a signal when both of two adjacent contacts 16 or 31 output a signal indicating a detection event.

Therefore, the overall effect of the split event discrimination circuits 45 and 46 is to discriminate between (1) a signal from a single contact 16 or 19 detected as a signal output from an associated main AND gate 47, and (2) signals from two adjacent contacts 16 or 31 detected as a signal output from an intermediate AND gate 48. Thus, the use of the split event discrimination circuits 45 and 46 increases the spatial resolution by combining information from adjacent contacts 16 or 31. When an electron is incident on a portion of the layer 15 of semiconductor material intermediate adjacent contacts 16 or 31, the charge is distributed between those two adjacent contacts 16 or 31. The split event discrimination circuits exploit this for extra resolution. This extra resolution is only possible because the detector 10 is arranged to count electrons rather than collect charge.

Figure 13:
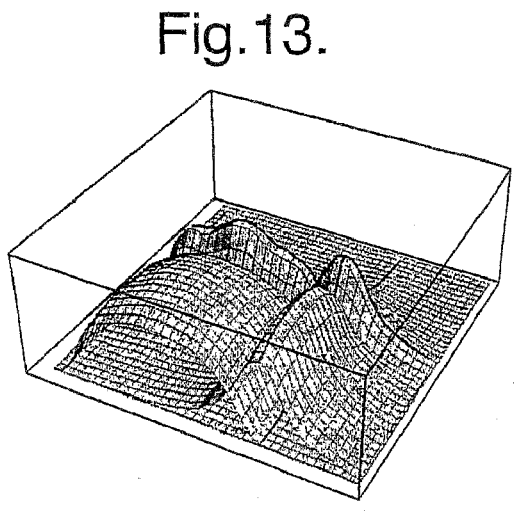
FIG. 13 is a three-dimensional surface plot of the probabilities of detection of an electron by a single pixel and jointly by the single pixel and adjacent pixels.
Figure 14:
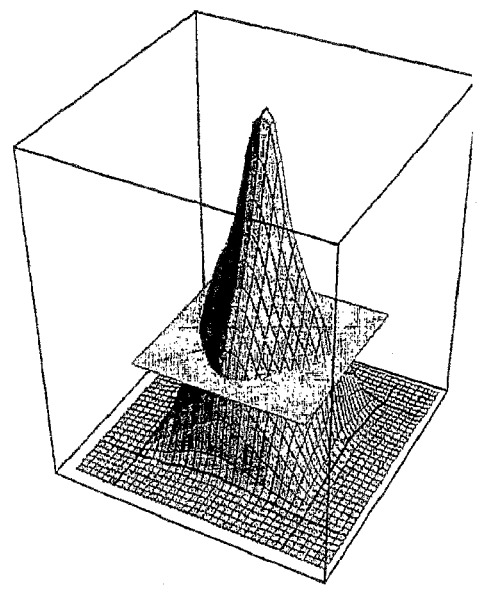
FIG. 14 is a three-dimensional surface plot of the effective probability of detection of an electron for the case that split event discrimination is employed.

In addition, the split event discrimination circuits 45 and 46 have the benefit of improving sensitivity. This benefit is illustrated in FIGS. 13 and 14 which are three-dimensional surface plots of the probability of detection of an electron as a function of the incident position relative to the pixel boundaries shown in thick black lines. FIG. 13 has four curves, one for the probability of detection in a single pixel alone, one for joint detection by the single pixel and an adjacent pixel in the z-direction, one for joint detection by the single pixel and an adjacent pixel in the y-direction, and one for joint detection by the single pixel and the diagonally adjacent pixel. In the case that no split event discrimination circuit is provided, effectively only the single pixel is used. Thus the point spread function is relatively broad, as shown by the curve for the single pixel alone, the information in the other curves being effectively lost. In contrast, FIG. 14 illustrates the case that the split event discrimination circuits 45 and 46 are present. It can be seen from FIG. 13 that for some incident positions there is a probability of detection on two adjacent pixels and thus as shown in FIG. 14, when a split event discrimination circuit is used, the point spread function is sharper than that of an ideal independent pixel which is illustrated by the horizontal plane in FIG. 14. In fact, the point spread function is sharper than the physical pixel size defined by the pitch of the contacts 16 and 31. As the number of pixels is effectively twice the number of contacts 16 or 31 in the particular array of contacts 16 or 31, the resultant image contains the information beyond the conventional Nyquist limit.

Whilst the particular logic circuit of the split event discrimination circuits 45 and 46 described above is preferred for simplicity, similar effects can be achieved by other logic circuits.

The signals from the split event discrimination circuits 45 and 46 are supplied to respective binary encoders 49 and 50 which convert the logical signal output by the split event discrimination circuits 45 and 46 into an address representing the one-dimensional position of the detection event along the respective array of contacts 16 or 31. In addition, each binary encoder 49 or 50 generates an event signal when any detection event is detected and a veto signal when more than one detection event is detected simultaneously.

The signals from both binary encoders 49 and 50 are supplied to a coincidence detector 51. The signals from one of the binary encoders 50 are supplied to the coincidence detector 51 through a coupling circuit 52 which decouples the absolute potential of the two binary encoders 49 and 50, the absolute potentials being different due to the reverse bias applied across the contacts 16 and 31.

The coincidence detector 51 detects when signals from the array of contacts 16 are coincident in time with signals from the array of contacts 31. Such coincidence is detected by monitoring the two event signals from the two binary encoders 49 and 50. On detecting such coincidence signals, the coincidence detector 51 outputs an event signal, together with the pixel number of the pixel representing the address of the pixel in two dimensions representing the position in both the arrays of contacts 16 and 31.

However, the coincidence detector 51 produces no output when it receives a veto signal from either one of the binary encoders 49 or 50 indicating that more than one event signal has been simultaneously detected. The reason is that it is difficult to resolve the position in the case of simultaneous detection of two electrons, because there are various possible positions corresponding to different combinations of the contacts of contacts 16 and 31. Such rejection prevents the occurrence of errors in the detected position at the expense of reducing the detection efficiency.

The signals from the coincidence detector 51 are supplied to a FIFO (first-in-first-out) buffer 53. The pixels addresses stored in the FIFO buffer 53 are supplied to the address input of a frame memory 54. The frame memory is preferably a fast (e.g 200 MHz) pipelined Zero Bus Turnaround Static Random Access Memory which can handle event rates of up to $100 \times 10^6$ events per second. An incrementor 55 is connected to the data input/output of the frame memory 54 to cause the pixels in the frame memory 54 corresponding to the detection event to be incremented. As a result, the frame memory 54 stores a count of the detected electrons at the respective pixels identified by the pixel addresses.

The frame memory 54 contain several image banks so that a preceding frame may be read out while a later frame is being accumulated.

To provide for readout of the stored images, the signal processing circuit has a read-out address generator 56 which incrementally reads out each address of a frame. The addresses from the read-out generator 56 and the FIFO buffer 53 are multiplexed together in an address multiplexer 57 before supply to the address input of the frame memory 54. The signal read out from the frame memory 54 is supplied to the output terminal 58 which may be formed on the surface of the semiconductor wafer 11.

In the signal processing circuit shown in FIG. 12: the amplifier circuit 42, the split event discrimination circuit 45 and the binary encoder 49 are arranged in the integrated circuit chips 28; the amplifier circuit 43, the split event discrimination circuit 46, the binary encoder 50 and the coupling circuit 52 are arranged in the further integrated circuit chips 37; and the coincidence detector 51 and elements downstream thereof are formed in the external circuit 26, preferably in a field programmable gate array. As an alternative, all the signal processing circuit could be formed in the integrated circuit chips 28 and 37 mounted on the semiconductor wafer 11.

The signal processing circuit for the first detector 10 is the same as for the second detector 30 as shown in FIG. 12 and described above, except that the amplifier circuit 43, the split event discrimination circuit 46, the coupling circuit 52 and the coincidence detector are omitted because the signal from the single contact 19 on the second side of the semiconductor wafer 11 is not monitored. In this case, another alternative is to connect counter circuits to directly count events detected on each contact 16, which alternative has the advantage of providing a high count rate.

The detectors 10 and 30 described above are primarily intended to detect electrons having an energy greater than 10 keV, which is a typical energy for electrons detected in a transmission electron microscope (TEM). In other applications it is desirable to detect electrons below 10 keV, for example electrons which are back-scattered. In the low part of the range below 10 keV, particularly approaching 100 eV, there may be insufficient sensitivity for detection. However, it is expected that the sensitivity may be improved to achieve sufficient sensitivity by taking measures such as (a) using an alternative semiconductor construction such as an avalanche diode construction mentioned above; (b) measuring the sensitivity of the amplifiers 44 and/or (c) operating at low temperatures to reduce background noise. Subject to this proviso about the low part of the range, the detectors 10 and 30 are capable of detecting electrons with an energy in the range from 100 eV to 5 MeV. They are sufficiently sensitive to directly detect and count incident electrons without requiring integration over time. As such the detectors 10, 30 can be used in any application requiring such detection of electrons. One particular application is in electron microscopy, in particular transmission electron microscopy (TEM). However, the detectors 10, 30 are equally applicable to other applications requiring detection of electrons such as electron energy loss spectrometers (EELS).

Figure 15:
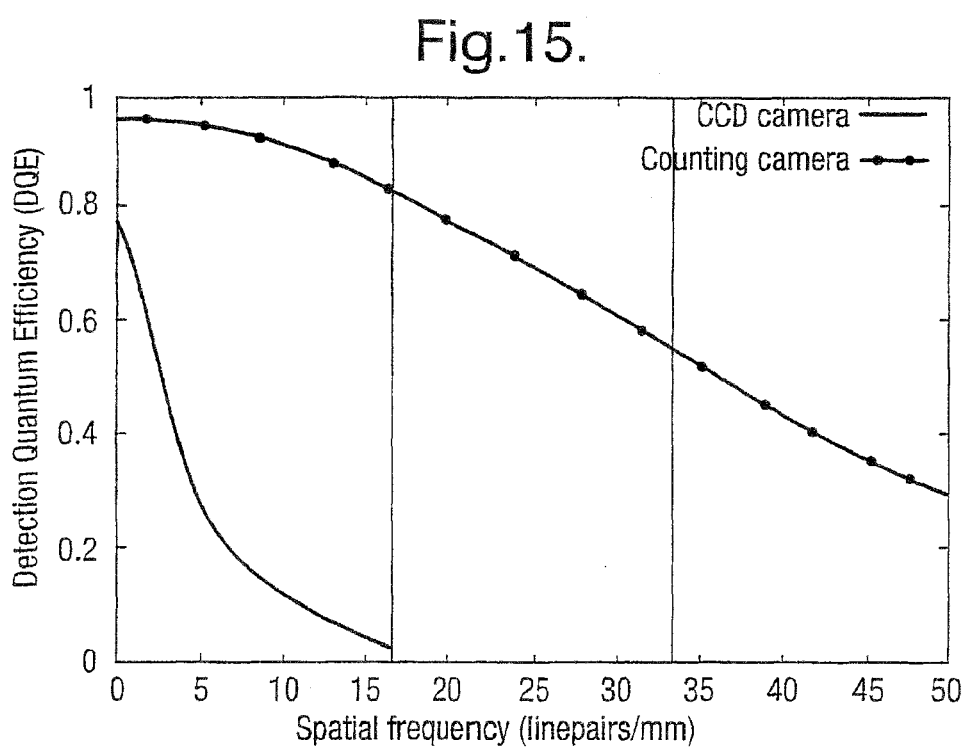
FIG. 15 is a graph of the detection quantum efficiency of first and second detector and of a CCD camera against spatial frequency.

The detectors 10 and 30 are capable of achieving a relatively high spatial resolution and relatively high quantum efficiency. The reason for achieving a relatively high spatial resolution is described above with reference to FIGS. 10 and 11. The relatively high quantum efficiency is shown in FIG. 15 which illustrates Detection Quantum Efficiency (DQE) as a function of spatial frequency in the detection of 300 keV electrons for both the detector 10 or 30 with a 15 μm pixel size shown by a continuous line and a CCD camera with a 30 μm pixel size shown by a dotted line. The Nyquist limits are marked with vertical lines. Due to the split event discrimination, the detector 10 or 30 can provide information beyond its Nyquist frequency. From FIG. 15, it is clear that the DQE of the detector 10 or 30 is expected to be dramatically higher than that of current CCD cameras. It should be noted that for the CCD camera, the displayed graph is the high dose limit. For low doses, and for short exposure times, the DQE is further deteriorated by dark current and readout noise. For the detector 10 or 30, the displayed graph is the limit for low dose rate and the DQE is reduced at very high dose rate because of the increasing number of overlapping events. Unlike CCD cameras, the detector 10 or 30 can be read out simultaneously with image acquisition at a frame rate that is only limited by the transfer speed to the computer. This high frame rate is of particular importance for the application of the one-dimensional detector 10 for EELS. Alternatively, record of each event can be kept at a timing resolution of 10 ns or faster, possibly enabling novel experiments to be performed by an electron microscope.

Whilst the detectors 10 and 30 in accordance with the present invention have been designed for detecting electrons with energies in the range from 100 eV to 5 MeV, they are expected to be suitable for detecting electrons with energies outside this range and also for detecting other charged particles with corresponding energies. The interaction of other charged particles with the semiconductor will be similar resulting in the same advantages as for detection of electrons.

The invention claimed is:

1. An electron detector for detection of electrons, comprising a semiconductor wafer made of silicon and having an active area with an array of contacts on a first side of the active area being one of n-type or p-type and a second array of contacts on a second, opposite side of the active area being the other of n-type or p-type, wherein the contacts in the array of contacts are shaped as strips, wherein the contacts in the second array of contacts are shaped as strips, where the contacts in the second array of contacts extend in a different direction from the contacts in the array of contacts on the first side of the active area, wherein the thickness of the active area of the semiconductor wafer is at most 150 μm.

2. The electron detector according to claim 1, wherein the active area of the semiconductor wafer is formed in a portion of the semiconductor wafer which is thinner than the remainder of the semiconductor wafer.

3. The electron detector according to claim 2, wherein said portion of the semiconductor wafer is etched.

4. The electron detector according to claim 1, wherein the contacts in the second array of contacts extend in an orthogonal direction from the contacts in the array of contacts on the first side of the active area.

5. The electron detector according to claim 1, further comprising conductive terminals contacting respective contacts of both arrays of contacts.

6. The electron detector according to claim 5, wherein the semiconductor wafer has vias and the conductive terminals contacting the second array of contacts on the second side of active area of the semiconductor wafer extend through the vias to allow connection to be made to all the conductive terminals on the first side of the semiconductor wafer.

7. The electron detector according to claim 5, further comprising a signal processing circuit connected to the conductive terminals and arranged to process signals from the contacts contacted by the conductive terminals to provide detection of electrons incident on the active area of the semiconductor wafer.

8. The electron detector according to claim 7, wherein at least part of the signal processing circuit is formed in at least one integrated circuit chip mounted on the semiconductor wafer outside the active area of the semiconductor wafer.

9. The electron detector according to claim 7, wherein the signal processing circuit includes amplifiers for amplifying signals from the contacts contacted by the conductive terminals.

10. The electron detector according to claim 7, wherein the signal processing circuit includes a split event discrimination circuit arranged to discriminate between a signal from a single contact and signals from two adjacent contacts.

11. The electron detector according to claim 7, wherein the signal processing circuit includes a coincidence detector arranged to detect coincident signals from overlapping contacts on opposite sides of the of the active area of the semiconductor wafer.

12. The electron detector according to claim 7, wherein the signal processing circuit includes a memory arranged to store a count of detected electrons at different locations across the electron detector.

13. The electron detector claim 1, wherein the active area of the semiconductor wafer has a thickness of at most 100 μm.

14. The electron detector according to claim 1, wherein the semiconductor wafer includes, in at least the active area, a layer of intrinsic material between the array of contacts on the first side of the active area and the second array of contacts on the second side of the active area.

15. The electron detector according to claim 1, wherein the contacts are deposited on the surface of the semiconductor wafer.

16. The electron detector according to claim 1, wherein a pitch of the contacts of the array of contacts and the contacts of the second array of contacts is at most 100 μm.

17. The electron detector according to claim 1, wherein a pitch of the contacts of the array of contacts and the contacts of the second array of contacts is at most 50 μm.

18. The electron detector according to claim 1, wherein a pitch of the contacts of the array of contacts and the contacts of the second array of contacts is at most 10 μm.

19. The electron detector according to claim 1, wherein the semiconductor wafer is a float zone wafer.

* * * * *

UNITED STATES PATENT AND TRADEMARK OFFICE
CERTIFICATE OF CORRECTION

PATENT NO. : 7,888,761 B2
APPLICATION NO. : 12/414073
DATED : February 15, 2011
INVENTOR(S) : Rudiger Reinhard Meyer et al.

It is certified that error appears in the above-identified patent and that said Letters Patent is hereby corrected as shown below:

On the title page, item [57]:
Abstract
Line 10, "may detected" should read --may be detected--.

Column 1,
Line 25, "de Ruijter, W.J., AImaging" should read --in de Ruijter, W.J., Imaging--.
Line 27, "microscopy@," should read --microscopy,--.
Line 37, "bright and spot" should read --bright spot--.
Line 47, "2 k×2 k" should read --2k × 2k--.
Line 57, "Ultramicroscopy@," should read --Ultramicroscopy,--.

Column 2,
Line 1, "imaging@," should read --imaging,--.

Column 3,
Line 32, "adjacent the contacts" should read --adjacent contacts--.

Column 5,
Line 40, "material, The contacts" should read --material. The contacts--.

Column 8,
Line 46, "16 and similarly," should read --16 and, similarly,--.

Column 12,
Line 44, "discriminations circuits" should read --discrimination circuits--.

Signed and Sealed this
Seventeenth Day of May, 2011

David J. Kappos
*Director of the United States Patent and Trademark Office*

CERTIFICATE OF CORRECTION (continued)

Column 14,
Line 20, "Memory which" should read --Memory, which--.
Line 27, "memory 54 contain" should read --memory 54 contains--.
Line 30, "generator 56 which" should read --generator 56, which--.
Line 36, "terminal 58 which" should read --terminal 58, which--.

Column 16,
Lines 12-13, "of active area" should read --of the active area--.
Line 38, "sides of the of the active" should read --sides of the active--.
Line 44, "detector claim 1," should read --detector according to claim 1,--.